(12) United States Patent
Weber et al.

(10) Patent No.: US 7,876,577 B2
(45) Date of Patent: Jan. 25, 2011

(54) SYSTEM FOR ATTACHING ELECTRONIC COMPONENTS TO MOLDED INTERCONNECTION DEVICES

(75) Inventors: Ronald Martin Weber, Annville, PA (US); Sheldon Lynn Horst, Columbia, PA (US)

(73) Assignee: Tyco Electronics Corporation, Middletown, PA (US)

( * ) Notice: Subject to any disclaimer, the term of this patent is extended or adjusted under 35 U.S.C. 154(b) by 706 days.

(21) Appl. No.: 11/684,665

(22) Filed: Mar. 12, 2007

(65) Prior Publication Data

US 2008/0222876 A1   Sep. 18, 2008

(51) Int. Cl.
*H05K 7/04* (2006.01)
(52) U.S. Cl. .................. 361/807; 361/760; 361/761; 361/809; 361/810; 361/764; 174/260; 29/836
(58) Field of Classification Search ............ 361/807, 361/761
See application file for complete search history.

(56) References Cited

U.S. PATENT DOCUMENTS

| | | | | |
|---|---|---|---|---|
| 4,970,624 A | * | 11/1990 | Arneson et al. ............ 361/749 |
| 5,055,637 A | * | 10/1991 | Hagner ...................... 174/260 |
| 5,606,198 A | * | 2/1997 | Ono et al. .................. 257/666 |
| 5,943,216 A | * | 8/1999 | Schmidt ..................... 361/761 |
| 6,323,440 B1 | * | 11/2001 | Maruyama et al. ......... 174/262 |
| 6,888,064 B2 | * | 5/2005 | Gilliland .................... 174/521 |
| 6,888,072 B2 | * | 5/2005 | Tsukamoto et al. ........ 174/260 |
| 6,933,443 B2 | * | 8/2005 | Osthaus .................... 174/524 |
| 7,061,076 B2 | * | 6/2006 | Shiffer ...................... 257/649 |

* cited by examiner

*Primary Examiner*—Hung S Bui
*Assistant Examiner*—Steven Sawyer

(57) ABSTRACT

A system for connecting electrical devices to one another is provided. This system includes a horizontal or non-horizontal substrate and an anchor connected to or formed integrally with the substrate. The anchor is either a raised structure or a recessed structure, and further includes at least one retention member formed integrally with the anchor. At least one electronic component is mounted within the anchor and the at least one retention member secures the component to the substrate. At least one electrical trace is disposed on the substrate and the at least one electrical trace extends into the anchor, contacts the at least one electronic component, and forms an electrical connection between the substrate and the at least one electronic component.

10 Claims, 1 Drawing Sheet

SYSTEM FOR ATTACHING ELECTRONIC COMPONENTS TO MOLDED INTERCONNECTION DEVICES

BACKGROUND OF THE INVENTION

The described invention relates in general to a system for attaching electrical components or electronic components to a substrate and more specifically to a system, device, and method for securing surface-mount devices to molded interconnection devices during affixation by reflow soldering or other methods.

Surface mount technology (SMT) is a known industrial process for constructing electronic circuits in which electrical or electronic components are mounted directly onto a substrate such as a printed circuit board (PCB). Electronic components that are suitable for mounting on such substrates are known as surface-mount devices or "SMDs". At the positions where SMDs are to be mounted, typical PCBs include flat, electrically conductive pads referred to as solder pads. During the construction process, solder paste is first applied to all the solder pads; then, if components are to be mounted on the second side, a numerically controlled machine places small liquid adhesive dots at the locations of all second-side components. The boards then proceed to pick-and-place machines, where they are placed on a conveyor belt. Small SMDs are usually delivered to the production line on paper or plastic tapes wound on reels. Integrated circuits are typically delivered stacked in static-free plastic tubes or trays. Numerically controlled pick-and-place machines remove the parts from the reels or tubes and place them on the PCB. Second-side components are placed first, and the adhesive dots are quickly cured with application of low heat or ultraviolet radiation. The boards are flipped over and first-side components are placed by additional numerically controlled machines. The use of adhesive dots in this construction process typically requires the surface or substrate to which the various components will be mounted to be held in a horizontal and upright orientation. Additionally, the components are only secure on the surface or substrate to which they are mounted following the low heat or ultraviolet radiation curing process.

The PCBs are then conveyed into a reflow soldering oven. They enter a pre-heat zone where the temperature of the board and all the components is gradually, uniformly raised to minimize thermal stresses when the assemblies cool down after soldering. The boards then enter a zone where the temperature is high enough to melt the solder particles in the solder paste; thereby bonding the component leads to the pads on the circuit board. The surface tension of the molten solder keeps the components in place, and if the solder pad geometries are correctly designed, surface tension automatically aligns the components on their pads. There are a number of techniques for reflowing solder including infrared reflow and various hot gas techniques.

While effective with PCBs, the reflow soldering process is problematic when used with other substrates such as molded interconnection devices (MID). One complication associated with the reflow soldering process occurs when there are multiple, non-parallel or non-horizontal surfaces to which SMDs are to be attached. If the surfaces on an MID to which the SMT components are to be attached are not all horizontally oriented, SMDs may exhibit a tendency to slide off of the MID as the solder paste begins to flow. Movement of the components in this manner is highly undesirable and may result in the assembly of a non-functional or otherwise faulty device. Thus, there is a need for a system and method that will immediately secure SMT components to MIDs or other substrates during reflow soldering or other assembly/affixation processes when the MIDs or other substrates are not horizontally oriented.

SUMMARY OF THE INVENTION

The following provides a summary of exemplary embodiments of the present invention. This summary is not an extensive overview and is not intended to identify key or critical aspects or elements of the present invention or to delineate its scope.

In accordance with one aspect of the present invention, a system for connecting electrical devices to one another is provided. This system includes a substrate and at least one anchor device connected to or formed integrally with the substrate. The anchor device is either a raised structure (or series of structures) or a recessed structure and further includes at least one retention member formed integrally with the anchor. At least one electronic component is mounted within the anchor device and the at least one retention member secures the component to the substrate. At least one electrical trace is disposed on the substrate and extends at least partially into the anchor device. The trace terminates in pad or other structure that contacts the at least one electronic component for forming an electrical connection between the substrate and the at least one electronic component.

In accordance with another aspect of the present invention, a molded interconnection device is provided. This device includes at least one anchor device for securing an electronic component to the molded interconnection device; wherein the anchor is adapted to be connected to or formed integrally with the molded interconnection device and wherein the anchor device is further adapted to receive the electrical component; wherein the anchor device is either a raised structure (or series of structures) or a recessed structure on or within the molded interconnection device; wherein the anchor device further includes at least one retention member formed integrally with the anchor device; and wherein the at least one retention member physically engages the electronic component to secure the electrical component within the anchor device.

In yet another aspect of this invention, a method for connecting electrical devices to one another is provided. This method includes providing a substrate, wherein the substrate further includes: at least one anchor connected to or formed integrally with the substrate, wherein the anchor is either a raised structure or a recessed structure, and wherein the anchor further includes at least one retention member formed integrally with the anchor; and at least one electrical trace disposed on the substrate, wherein the at least one electrical trace extends into the anchor. An electronic or electrical component is then mounted within the anchor, wherein the at least one retention member secures the component to the substrate. The at least one electrical trace extends at least partially into the anchor and terminates in a pad or other structure that contacts the at least one electrical component for forming an electrical connection between the substrate and the at least one electrical component. The electronic component is then affixed to the substrate by reflow soldering, conductive epoxy, or by other means known to those skilled in the art.

Additional features and aspects of the present invention will become apparent to those of ordinary skill in the art upon reading and understanding the following detailed description of the exemplary embodiments. As will be appreciated by the skilled artisan, further embodiments of the invention are possible without departing from the scope and spirit of the invention. Accordingly, the drawings and associated descriptions are to be regarded as illustrative and not restrictive in nature.

BRIEF DESCRIPTION OF THE DRAWINGS

The accompanying drawings, which are incorporated into and form a part of the specification, schematically illustrate one or more exemplary embodiments of the invention and, together with the general description given above and detailed description given below, serve to explain the principles of the invention, and wherein.

DETAILED DESCRIPTION OF THE INVENTION

Figure 1:
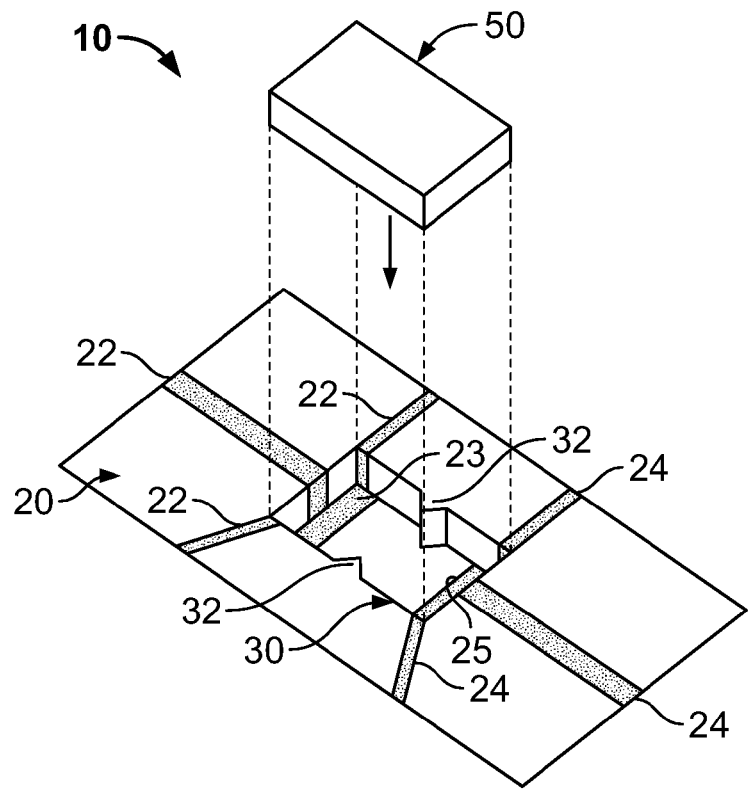
FIG. 1 is a simplified representation of a first exemplary embodiment of the present invention, wherein the anchor feature is recessed into the substrate.

Exemplary embodiments of the present invention are now described with reference to the Figures. Reference numerals are used throughout the detailed description to refer to the various elements and structures. In other instances, well-known structures and devices are shown in block diagram form for purposes of simplifying the description. Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

Figure 2:
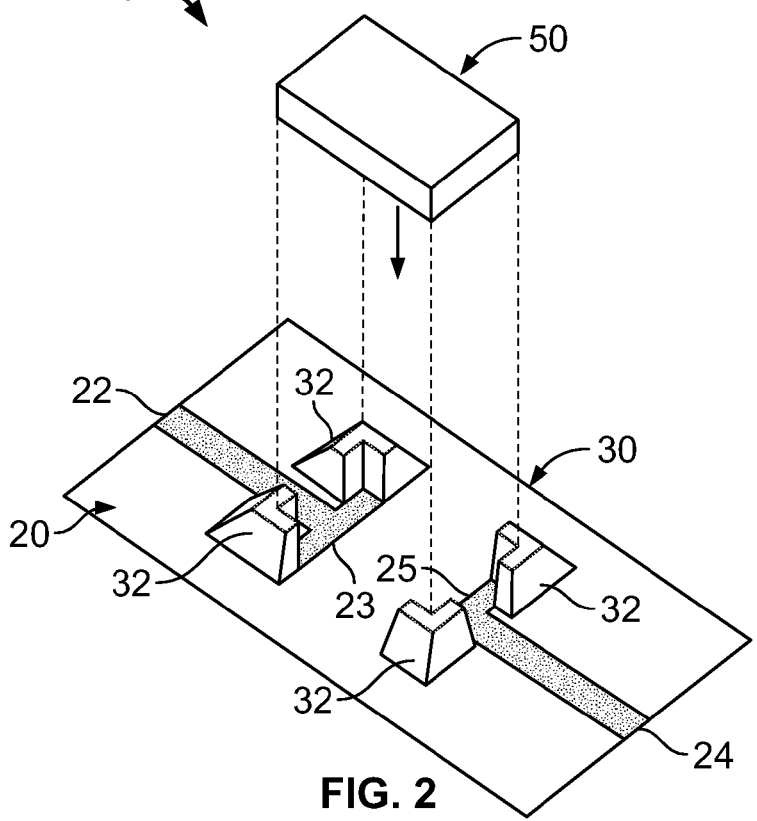
FIG. 2 is a simplified representation of a second exemplary embodiment of the present invention, wherein the anchor feature is raised above or mounted atop the substrate.

The present invention relates to a system and method for quickly and securely mounting electrical devices on non-horizontal substrates. With reference to the Figures, FIGS. 1-2 provide somewhat simplified representations of first and second exemplary embodiments of this invention. The first embodiment includes a recessed anchor feature and the second embodiment includes a raised anchor feature.

As shown in FIG. 1, a first exemplary embodiment of attachment system 10 includes a substrate 20 into which a "pocket" or anchor device 30 has been recessed for receiving electronic component 50, which is typically a surface-mount device (SMD). Substrate 20 is typically a molded interconnection device (MID), although other substrates are compatible with this invention. The depth of recessed anchor 30 may correspond to the height of electronic component 50, half-of the height of component 50, or any other depth convenient to secure component 50 to or within substrate 20. Anchor device 30 further includes two triangular pointed retention members 32, which physically engage electronic component 50 when the component is inserted into recessed anchor 30. In this embodiment, retention members 32 act as "crush ribs" that physically deform when electronic component 50 is inserted into recessed anchor device 30. First trace 22 is disposed across the horizontal surface of substrate 20, as is second trace 24, in one of several possible straight or angled orientations. Traces 22 and 24 extend down and across the walls of anchor 30 and terminate at solder pads 23 and 25 respectively. These solder pads contact corresponding surfaces on component 50 and form an electrical connection between substrate 20 and electronic component 50 when electronic component 50 is properly inserted into anchor device 30 and affixed to substrate 20. Electronic component 50 is typically a resistor, connector, capacitor, inductor, integrated circuit, or other electrical or electronic device.

As shown in FIG. 2, a second exemplary embodiment of attachment system 10 includes a substrate 20 on which anchor device 30 is either formed or attached for receiving electronic component 50, which is typically a surface-mount device (SMD). Substrate 20 is typically a molded interconnection device (MID) or the like. In this embodiment, anchor device 30 includes a plurality of raised right-angled retention members 32 that form a partial enclosure for electronic component 50. The height of these retention members may correspond to the height of electronic component 50, half-of the height of component 50, or any other height convenient to secure component 50 to or within substrate 20. First trace 22 is disposed along the horizontal surface of substrate 20, as is second trace 24, in one of several possible straight or angled orientations. Traces 22 and 24 extend into anchor 30 as shown in FIG. 2 and terminate at solder pads 23 and 25 respectively. These solder pads contact corresponding surfaces on component 50 and form an electrical connection between substrate 20 and electronic component 50 when electronic component 50 is properly inserted into anchor 30 and affixed to substrate. Electronic component 50 is typically a resistor, connector, capacitor, inductor or other similar device.

The present invention also provides a method for connecting or securing electronic components (i.e., surface-mount devices) to a substrate during the process of assembling a functional MID by utilizing an anchoring feature molded into or onto the MID. An exemplary version of this method includes providing a multi-surface (i.e., multi-planar) substrate 20, wherein substrate 20 further includes: at least one anchor connected 30 to or formed integrally with the substrate, wherein anchor 30 is either a raised structure, a series or raised structures, or a recessed structure, and wherein anchor 30 further includes at least one retention member 32 formed integrally therewith. Substrate 20 also includes multiple electrical traces disposed thereon, wherein each electrical trace extends at least partially into an anchor 30 and terminates at an individual solder pad. An electronic component 50 is mounted into each anchor 30 and retention members 32 secure each component 50 to the substrate 20. The solder pads of each electrical trace contacts a corresponding electrical surface on component 50 for forming an electrical connection therebetween. Reflow soldering or conductive epoxy is then used to affix electronic component 50 to the solder pads. Thus, the present invention utilizes a molded feature or set of features added to an MID to accomplish the task of holding SMDs securely in position on various planes and surfaces of an MID during a reflow solder process or during the curing period of a conductive epoxy used to secure and connect the SMDs to the MID. Advantageously, unlike prior art systems that utilize adhesive dots or the like, the substrates or surfaces to which the SMDs are mounted using the system of the present invention need not be horizontally oriented. Furthermore, the anchor structures of this invention eliminate the need for heat or ultraviolet curing or other treatment prior to subsequent processing.

While the present invention has been illustrated by the description of exemplary embodiments thereof, and while the embodiments have been described in certain detail, it is not the intention of the Applicant to restrict or in any way limit the scope of the appended claims to such detail. Additional advantages and modifications will readily appear to those skilled in the art. Therefore, the invention in its broader aspects is not limited to any of the specific details, representative devices and methods, and/or illustrative examples shown and described. Accordingly, departures may be made from such details without departing from the spirit or scope of the applicant's general inventive concept.

What is claimed:

1. A system for connecting electrical devices to one another, comprising:
   (a) a substrate comprising a molded interconnection device, wherein the substrate is horizontally oriented or non-horizontally oriented;
   (b) at least one anchor device recessed within the substrate, wherein the at least one recessed anchor device further includes a plurality of recessed contiguous walls having a first protruding triangular retention member and a second protruding triangular retention member formed opposite one another on two of the plurality of recessed walls of the anchor device, wherein the first and second protruding retention members are non-conductive;
   (c) at least one electronic component mounted within the at least one recessed anchor device, wherein the first and second protruding triangular retention members laterally deform when the at least one electronic component is inserted into the recessed anchor device and wherein the first and second protruding triangular retention members physically contact and secure the at least one electronic component to the substrate; and
   (d) at least one electrical trace disposed on the substrate, wherein the at least one electrical trace extends down and across at least one of the plurality of recessed and contiguous walls of the anchor device; and
   (e) at least one solder pad disposed in the recessed anchor device and in electrical contact with the at least one electrical trace, wherein the at least one solder pad contacts the at least one electronic component for forming an electrical connection between the substrate and the at least one electrical component.

2. The system of claim 1, further comprising electrically conductive means for affixing the electronic component to the at least one solder pad.

3. The system of claim 1, wherein the electrical devices comprise surface-mount technology.

4. The system of claim 1, wherein the at least one electrical component is a surface-mount device.

5. The system of claim 1, wherein the at least one electrical component is a resistor, connector, capacitor, inductor, or SMT integrated circuit.

6. A molded interconnection device, comprising:
   (a) at least one anchor device for connecting at least one electronic component to the molded interconnection device;
   (b) wherein the at least one anchor device is connected to or formed integrally with the molded interconnection device;
   (c) wherein the at least one anchor device is adapted to receive the at least one electronic component and secure the at least one electronic component therein;
   (d) wherein the anchor device is recessed within the molded interconnection device and further includes a plurality of recessed contiguous walls having a first protruding triangular retention member and a second protruding triangular retention member formed opposite one another on two of the plurality of recessed walls, and wherein the first and second protruding triangular retention members are non-conductive; and
   (e) wherein the first and second protruding triangular retention members laterally deform when the at least one electronic component is inserted into the recessed anchor device and wherein the first and second protruding triangular retention members physically contact and engage the at least one electronic component when the at least one electronic component is mounted within the plurality of walls of the at least one recessed anchor device
   f) at least one electrical trace disposed on the molded interconnection device and partially disposed on at least one of the plurality of walls of the recessed anchor device; and
   (g) at least one solder pad disposed in the recessed anchor device and in electrical contact with the at least on electrical trace, wherein the at least one solder pad contacts the at least one electrical component for forming an electrical connection between the molded interconnection device and the electrical component.

7. A method for connecting electrical devices to one another, comprising;
   (a) providing a substrate, wherein the substrate further includes:
      (i) at least one recessed anchor device connected to or formed integrally with the substrate, wherein the at least one anchor device further includes a plurality of recessed contiguous walls having a first protruding triangular retention member and a second protruding triangular retention member formed opposite one another on two of the plurality of recessed walls of the substrate, wherein the first and second protruding triangular retention members are non-conductive;
      (ii) at least one electrical trace disposed on the substrate, wherein the at least one electrical trace extends at least partially into the at least one anchor device and across at least one of the plurality of recessed walls; and
      (iii) at least one solder pad in electrical contact with the at least one electrical trace, wherein the at least one solder pad is formed within the recessed anchor device; and
   (b) mounting an electrical component within the anchor device, wherein the first and second protruding triangular retention members secure the electrical component to the substrate, and wherein the first and second protruding triangular retention members laterally deform when the at least one electronic component is inserted into the recessed anchor device and physically contact the at least one electronic component, and wherein the at least one electrical trace contacts the at least one electrical component and the at least one solder pad, wherein the at least one solder pad forms an electrical connection between the substrate and the electrical component; and
   (c) affixing the electrical component to the substrate within the anchor device using reflow soldering or conductive epoxy.

8. The method of claim 7, wherein the substrate comprises a molded interconnection device, and wherein the substrate is horizontally oriented or non-horizontally oriented.

9. The method of claim 7, wherein the substrate is a printed circuit board.

10. The method of claim 7, wherein the at least one electrical component is a resistor, connector, capacitor, inductor, or SMT integrated circuit.

* * * * *